United States Patent
Yu et al.

(10) Patent No.: US 10,269,443 B2
(45) Date of Patent: Apr. 23, 2019

(54) MEMORY DEVICE AND TEST METHOD OF THE SAME

(71) Applicant: Realtek Semiconductor Corporation, Hsinchu (TW)

(72) Inventors: Chun-Chi Yu, Hsinchu County (TW); Chih-Wei Chang, Hsinchu County (TW); Shen-Kuo Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/894,844

(22) Filed: Feb. 12, 2018

(65) Prior Publication Data

US 2018/0233211 A1  Aug. 16, 2018

(30) Foreign Application Priority Data

Feb. 16, 2017  (TW) .............................. 106105125 A

(51) Int. Cl.
| | |
|---|---|
| *G11C 29/00* | (2006.01) |
| *G11C 29/02* | (2006.01) |
| *G11C 11/4076* | (2006.01) |
| *G11C 29/50* | (2006.01) |
| *G11C 11/409* | (2006.01) |
| *G11C 11/4063* | (2006.01) |

(52) U.S. Cl.
CPC .......... *G11C 29/025* (2013.01); *G11C 11/409* (2013.01); *G11C 11/4076* (2013.01); *G11C 29/028* (2013.01); *G11C 29/50008* (2013.01); *G11C 29/50012* (2013.01); *G11C 11/4063* (2013.01)

(58) Field of Classification Search
CPC ................ G11C 29/025; G11C 29/028; G11C 29/50008; G11C 29/50012; G11C 11/4063; G11C 11/4076; G11C 11/409
USPC ............... 365/201, 193, 185.09, 200, 233.18
See application file for complete search history.

(56) References Cited

U.S. PATENT DOCUMENTS

| | | | | |
|---|---|---|---|---|
| 7,171,321 | B2 * | 1/2007 | Best ..................... | G06F 13/1689 702/106 |
| 7,773,440 | B2 * | 8/2010 | Kim ........................ | G11C 7/04 326/30 |
| 8,233,336 | B2 * | 7/2012 | Mueller .............. | G06F 13/1694 365/189.07 |
| 2010/0271092 | A1 * | 10/2010 | Zerbe .................. | G06F 13/4243 327/161 |

(Continued)

*Primary Examiner* — Tan T. Nguyen
(74) *Attorney, Agent, or Firm* — CKC & Partners Co., LLC

(57) ABSTRACT

A memory test method is provided that includes the steps outlined below. The memory controller performs data-writing and data-reading on a memory module. When a quantity of read data is incorrect, a data-strobe enable signal is calibrated to perform data reading. When there is one of less than one piece of negative edge data reading content, a sampling unit is triggered. When the quantity of read data increases, the condition that the data-strobe signal is not received is determined. When the quantity does not increase, the memory controller is inspected. When there is more than one piece of read data, the burst mode setting of the memory module is inspected. When the quantity is correct and the content is not correct, a transmission circuit setting and the sampling unit are inspected. When the quantity and the content are correct, the test flow is terminated.

16 Claims, 3 Drawing Sheets

(56) References Cited

U.S. PATENT DOCUMENTS

| | | | | |
|---|---|---|---|---|
| 2012/0188833 A1* | 7/2012 | Yamahara | ............ | G11C 7/1072 365/193 |
| 2013/0070536 A1* | 3/2013 | Takai | ....................... | G11C 7/04 365/189.05 |
| 2014/0229668 A1* | 8/2014 | Oda | ..................... | G11C 7/1072 711/105 |
| 2016/0049183 A1* | 2/2016 | Bose | ..................... | G06N 20/00 365/193 |

* cited by examiner

MEMORY DEVICE AND TEST METHOD OF THE SAME

RELATED APPLICATIONS

This application claims priority to Taiwanese Application Serial Number 106105125, filed Feb. 16, 2017, which is herein incorporated by reference.

BACKGROUND

Field of Disclosure

The present disclosure relates to a test technology. More particularly, the present disclosure relates to a memory device and a test method of the same.

Description of Related Art

Current circuit design often utilizes the multi-chip module (MCM) packaging technology to dispose two or more than two dies within a package. However, waveforms of a memory device in a multi-chip module using such a packaging technology cannot be measured by using probes. Part of the measuring technologies use focus ion beam (FIB) to retrieve the signals. However, the number of the signals observed each time by using the FIB technology is limited. Further, not every signal can be retrieved by using the FIB technology.

Accordingly, what is needed is a memory device and a test method of the same to perform test on the memory device without using probes or FIB technology to figure out the issue that causes the abnormal data-reading of the memory module.

SUMMARY

An aspect of the present disclosure is to provide a memory test method for a memory device that includes a memory controller and a memory module. The memory test method includes the steps outlined below. Data-writing is performed on the memory module according to write data content by a memory controller and a data-strobe signal and a data signal are received from the memory module. The data signal is sampled by a sampling unit according to a positive edge and a negative edge of the data-strobe signal under a burst mode to perform data-reading to generate read data content. The write data content and the read data content are compared and when a quantity of the read data content does not correspond to the burst mode, a timing calibration is performed on a data-strobe enable signal to adjust the data-strobe enable signal to correspond to a preamble section of the data-strobe signal, wherein the data-strobe enable signal is configured to enable the input of the data-strobe signal. The data-reading is performed again, and when the quantity of the read data content does not correspond to the burst mode and when the read data content includes one or less than one piece of negative edge read data content, the sampling unit is triggered by the memory controller to sample the data signal. When the quantity of the read data content increases, the condition that the memory controller does not receive the data-strobe signal is determined. When the quantity of the read data content does not increase, a configuration of the memory controller is inspected. When the quantity of the read data content does not correspond to the burst mode and when the read data content comprises more than one piece of negative edge read data content, the configuration of the burst mode of the memory module is inspected. When the quantity of the read data content corresponds to the burst mode and the read data content does not match the write data content, the configuration of a transmission circuit of the memory controller and an operation of the sampling unit are inspected. When the quantity of the read data content corresponds to the burst mode and the read data content matches the write data content, the test flow is terminated.

Another aspect of the present disclosure is to provide a memory test device that includes a memory module and a memory controller. The memory controller includes a transmission circuit, a receiver circuit and a processing circuit. The transmission circuit is configured to perform data-writing on the memory module according to write data content. The receiver circuit includes a data-strobe enable unit, a data-strobe gate control unit and a sampling unit. The data-strobe enable unit is configured to generate a data-strobe enable signal. The data-strobe gate control unit is configured to start receiving a data-strobe signal from the memory module according to the data-strobe enable signal. The sampling unit is configured to receive a data signal from the memory module to sample the data signal according to a positive edge and a negative edge of the data-strobe signal under a burst mode to perform data-reading to generate read data content. The processing circuit is configured to compare the write data content and the read data content and when a quantity of the read data content does not correspond to the burst mode, the processing circuit controls the data-strobe enable unit to perform a timing calibration on the data-strobe enable signal to adjust the data-strobe enable signal to correspond to a preamble section of the data-strobe signal. The processing circuit controls the receiver circuit to perform the data-reading and when the quantity of the read data content does not correspond to the burst mode and when the read data content comprises one or less than one piece of negative edge read data content, the processing circuit triggers the sampling unit to sample the data signal, and wherein when the quantity of the read data content increases, the processing circuit determines that the memory controller does not receive the data-strobe signal, and when the quantity of the read data content does not increase, the processing circuit inspects a configuration of the memory controller. The processing circuit inspects the configuration of the burst mode of the memory module when the quantity of the read data content does not correspond to the burst mode and when the read data content comprises more than one piece of negative edge read data content. The processing circuit inspects the configuration of a transmission circuit of the memory controller and an operation of the sampling unit when the quantity of the read data content corresponds to the burst mode and the read data content does not match the write data content, and the processing circuit terminates the test flow when the quantity of the read data content corresponds to the burst mode and the read data content matches the write data content.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present invention. Moreover, the operation of the described structure is not for limiting the order of implementation. Any device with equivalent functions that is produced from a structure formed by a recombination of elements is all covered by the scope of the invention. Drawings are for the purpose of illustration only, and not plotted in accordance with the original size.

Figure 1:
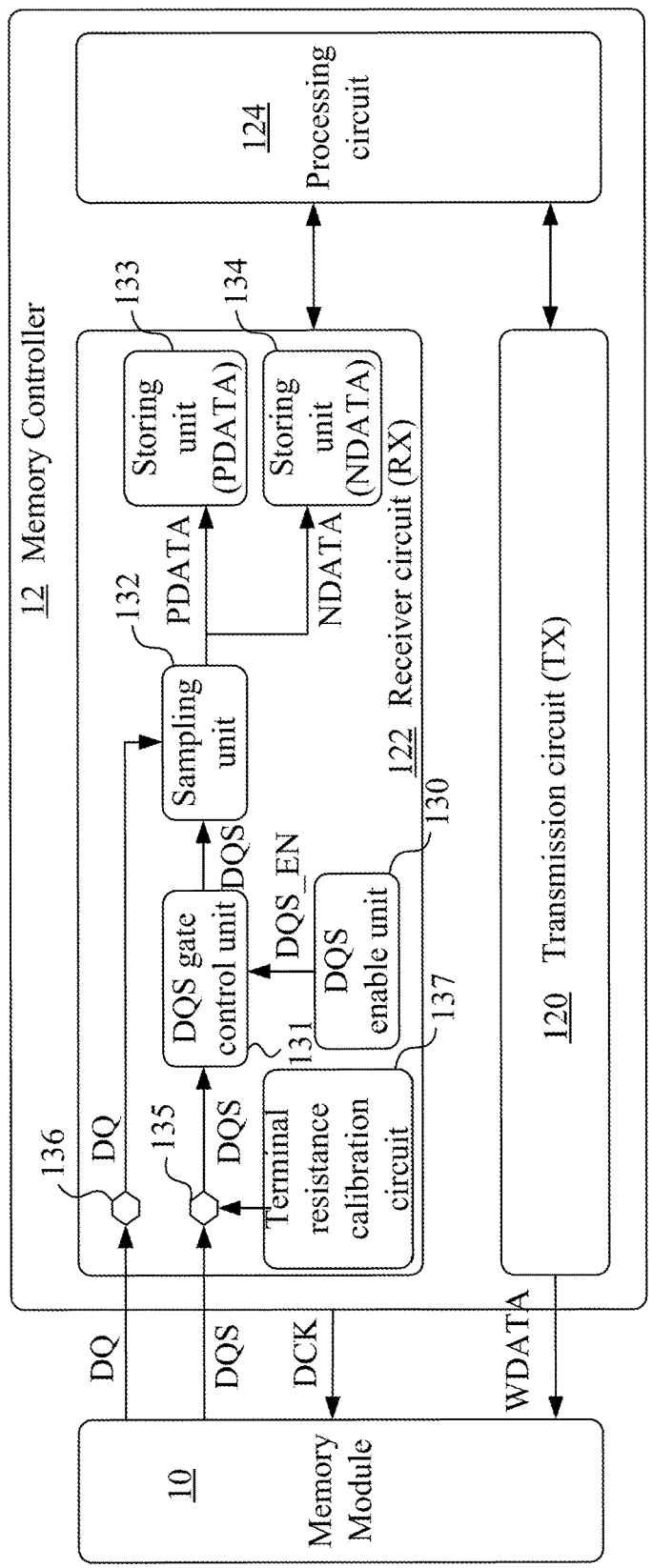
FIG. 1 is a block diagram of a memory device in an embodiment of the present invention.

FIG. 1 is a block diagram of a memory device 1 in an embodiment of the present invention. The memory device 1 includes a memory module 10 and a memory controller 12.

In an embodiment, the memory module is a double data rate synchronous dynamic random access memory (DDR SDRAM) and can be the type of DDR2, DDR3 or DDR4. In other embodiments, the memory module 10 can also be a lower power DDR SDRAM (LPDDR SDRAM) and can be type of LPDDR2, LPDDR3 or LPDDR4 SDRAM.

The memory controller 12 includes a transmission circuit (TX) 120, a receiver circuit (RX) 122 and a processing circuit 124. In an embodiment, the memory device 1 is disposed in a computer system (not illustrated) and the computer system may include a central processing unit and buses (not illustrated). The processing circuit 124 can receive the command from the central processing unit through the buses to access the memory module 10 by using the transmission circuit 120 and the receiver circuit 122 according to the command.

For example, under the control of the processing circuit 124, the memory controller 12 transmits data to the memory module 10 based on the write data content WDATA by using the transmission circuit 120 to perform data-writing. Further, the memory controller 12 receives the data signal DQ from the memory module 10 by using the receiver circuit 122 to perform data-reading.

As illustrated in FIG. 1, the receiver circuit 122 includes a data-strobe enable unit 130 (abbreviated as DQS enable unit in FIG. 1), a data-strobe gate control unit 131 (abbreviated as DQS gate control unit in FIG. 1), a sampling unit 132, a storage unit 133 for storing positive edge read data content, a storage unit 134 for storing negative edge read data content, a data-strobe port 135 and a data port 136.

Figure 2:
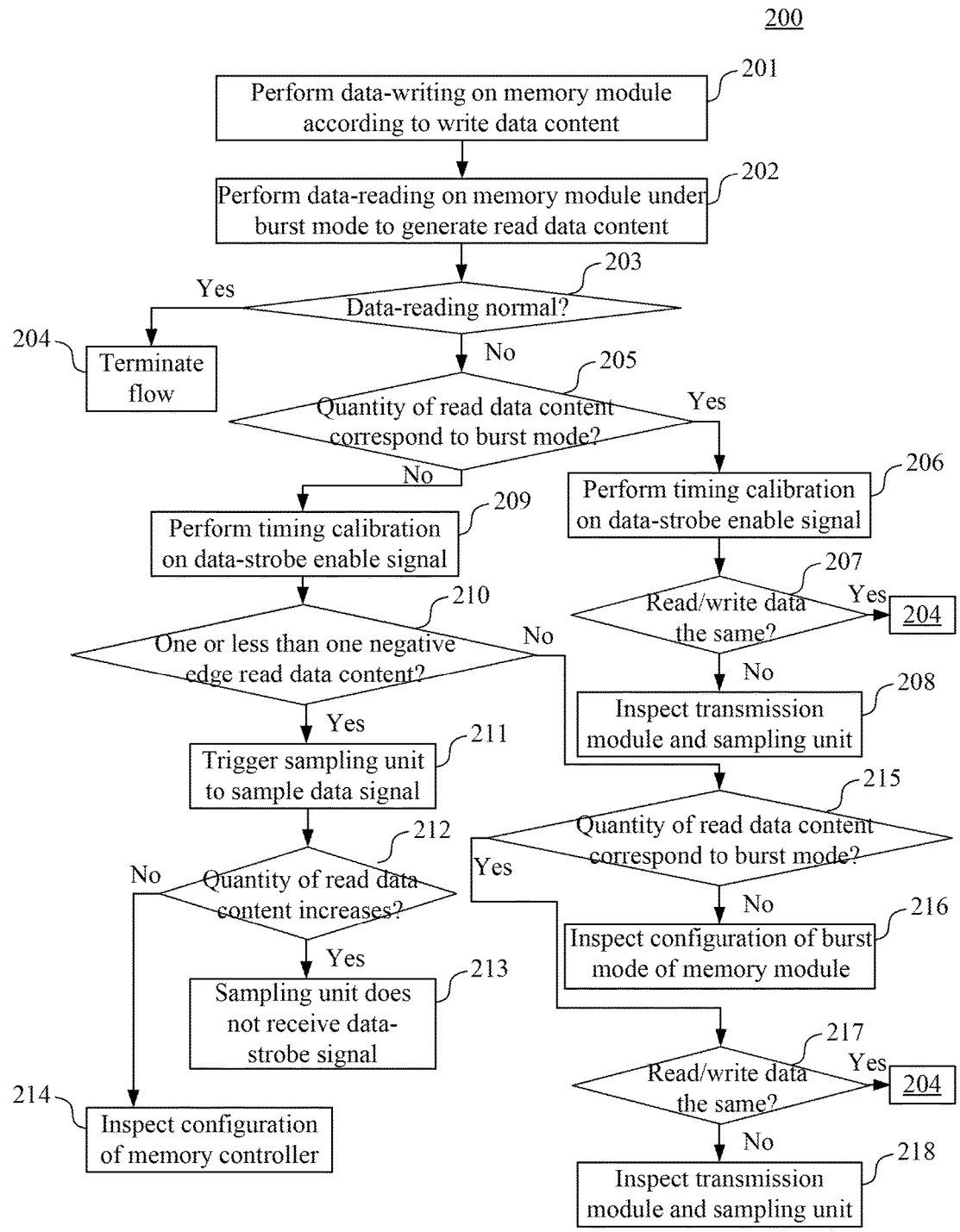
FIG. 2 is a flow chart of a memory test method in an embodiment of the present invention.

Reference is now made to FIG. 2. FIG. 2 is a flow chart of a memory test method 200 in an embodiment of the present invention. The memory test method 200 can be used in the memory device 1 illustrated in FIG. 1.

The operation of the memory device 1 and the memory test method 200 are described in detail in accompany with FIG. 1 and FIG. 2.

In step 201, the transmission circuit 120 performs data-writing on the memory module 10 according to the write data content WDATA.

In step 202, the receiver circuit 120 performs data-reading on the memory module 10 under the burst mode to generate the read data content.

Figure 3:
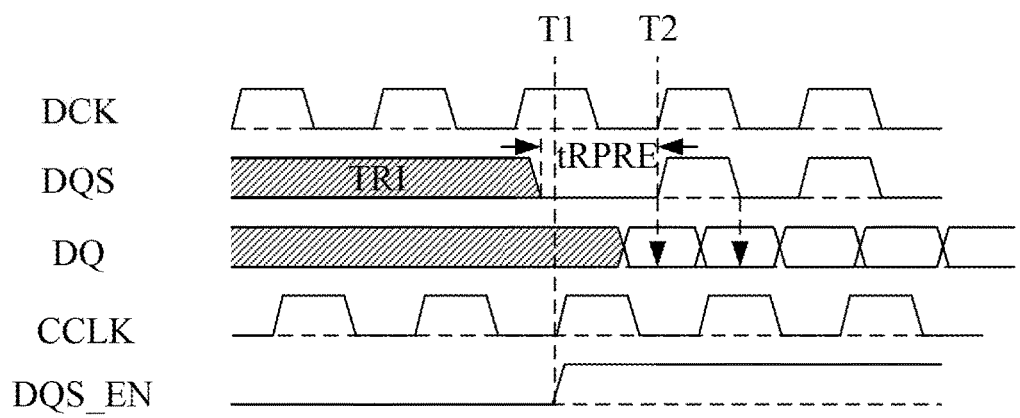
FIG. 3 is a diagram of waveforms of the signals transmitted between the memory module and the memory controller in an embodiment of the present invention.

Reference is now made to FIG. 3. FIG. 3 is a diagram of waveforms of the signals transmitted between the memory module 10 and the memory controller 12 in an embodiment of the present invention.

In an embodiment, when the data-reading is performed, the data-strobe enable unit 130 is configured to generate a data-strobe enable signal DQS_EN. The data-strobe gate control unit 131 is configured to start to receive the data strobe signal DQS from the memory module 10 through the data-strobe port 135 according to the data-strobe enable signal DQS_EN.

In the present embodiment, before the time spot T1, the data-strobe enable signal DQS_EN is at a low level and the data-strobe gate control unit 131 is not enabled. As a result, for the sampling unit 132, the data strobe signal DQS stays in a non-stable section TRI.

When the data-strobe enable signal DQS_EN transits from the low level to a high level at the time spot T1, the data-strobe gate control unit 131 starts to receive the data strobe signal DQS. As a result, the section between the end of the non-stable section TRI and the time spot T2 that the state of the data-strobe signal DQS starts to transit is the preamble section tRPRE of the data-strobe signal DQS.

The sampling 132 is configured to receive the data signal DQ from the memory module 10 to sample the data signal DQ at the positive edges and the negative edges after the time spot T2 according to the data-strobe signal DQS under the burst mode to perform data-reading to generate the read data content. The sampling unit 132 further stores the positive edge read data content PDATA sampled at the positive edge of the data-strobe signal DQS in the storage unit 133. The sampling unit 132 further stores the negative edge read data content NDATA sampled at the negative edge of the data-strobe signal DQS in the storage unit 134.

In an embodiment, the burst mode can be a four-piece data burst mode (burst4) or an eight-piece data burst mode (burst8). When the burst mode is set at the four-piece data burst mode, the sampling unit 132 reads two pieces of the positive edge read data content PDATA and two pieces of the negative edge read data content NDATA under the normal data-reading condition. The positive edge read data content PDATA and the negative edge read data content NDATA are stored in the storage unit 133 and the storage unit 134.

When the burst mode is set at the eight-piece data burst mode, the sampling unit 132 reads four pieces of the positive edge read data content PDATA and four pieces of the negative edge read data content NDATA under the normal data-reading condition. The positive edge read data content PDATA and the negative edge read data content N DATA are stored in the storage unit 133 and the storage unit 134.

The above description is made by using the four-piece data burst mode and the eight-piece data burst mode as an example. In other embodiments, the burst mode can also be sixteen-piece data burst mode or thirty-two-piece data burst mode.

It is appreciated that in an embodiment, the memory module 10 is operated according to the clock signal DCK and the clock signal DCK is transmitted by the memory controller 12. As a result, the transition point of the data-strobe signal DQS transmitted by the memory module 10 corresponds to the clock signal DCK. The inner circuit modules of the memory controller 12 are operated according to the inner clock signal CCLK thereof. As a result, the transition point of the data-strobe enable signal DQS_EN corresponds to the clock signal CCLK.

In step 203, the processing circuit 124 is configured to compare the write data content WDATA and the positive and negative edge read data content PDATA and NDATA to determine whether the data-reading is normal.

When the quantity of the positive and negative edge read data content PDATA and NDATA corresponds to the burst mode and the content of the write data content WDATA matches the content of the positive and negative edge read data content PDATA and NDATA, the processing circuit 124 determines that the data-reading is normal and terminates the flow in step 204.

When the data-reading is abnormal, in step 205, the processing circuit 124 determines whether the quantity of the positive and negative edge read data content PDATA and NDATA correspond to the burst mode.

When the quantity of the positive and negative edge read data content PDATA and NDATA corresponds to the burst mode, in step 206, a timing calibration is performed on the data-strobe enable signal DQS_EN by the processing circuit 124 to adjust the data-strobe enable signal DQS_EN to correspond to the preamble section of the data-strobe signal tRPRE.

Since the data-strobe enable signal DQS_EN may enable the input of the data-strobe signal DQS at a wrong time spot and further cause the wrong data-sampling result, the data-strobe gate control unit 131 can be enabled at the appropriate timing according to the timing calibration of the data-strobe enable signal DQS_EN. The sampling unit 132 can perform data-sampling at the correct timing according to the data-strobe signal DQS.

The method to perform the timing calibration of the data-strobe enable signal DQS_EN in an embodiment of the present invention is exemplarily described in the following paragraphs.

In an embodiment, the receiver circuit 122 further includes a terminal resistance calibration circuit 137 electrically coupled to the data-strobe port 135 to control the data-strobe port 135 to be either at the low level or the high level.

Figure 4:
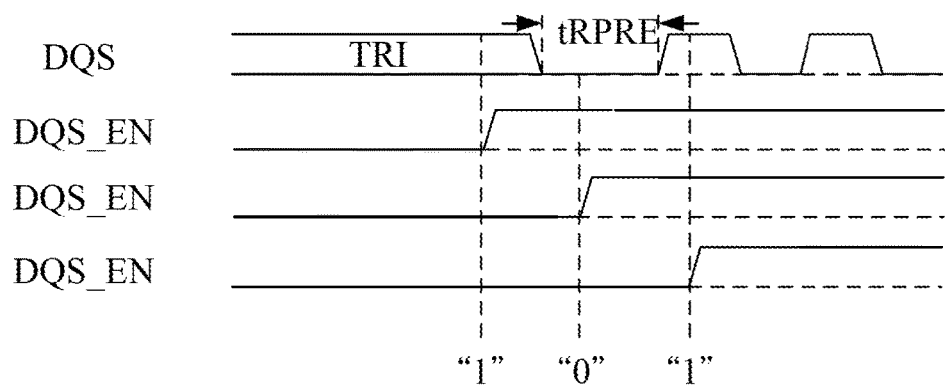
FIG. 4 is a diagram of waveforms of the data-strobe enable signal and the data-strobe signal during the timing calibration in an embodiment of the present invention.

Reference is now made to FIG. 4. FIG. 4 is a diagram of the waveforms of the data-strobe enable signal DQS_EN and the data-strobe signal DQS during the timing calibration in an embodiment of the present invention.

When the timing calibration of the data-strobe enable signal DQS_EN is performed, the processing circuit 124 can control the terminal resistance calibration circuit 137 to further control the data-strobe port 135 to be at such as, but not limited the high level during the non-stable section TRI of the data-strobe signal DQS.

The processing circuit 124 further controls the data-strobe enable unit 130 to change the timing of the data-strobe enable signal DQS_EN and keeps sampling the data-strobe signal DQS by using the data-strobe enable signal DQS_EN. When the processing circuit 124 detects the transition of the levels of the sampling result, e.g. the transition of the sampling result from "1" to "0" illustrated in FIG. 4, the processing circuit 124 determines that the position of the "0" is the preamble section tRPRE. Therefore, the data-strobe enable unit 130 enables the data-strobe gate control unit 131 by using the data-strobe enable signal DQS_EN at the corresponding time spot such that the sampling unit 132 performs data-sampling at the correct time spot.

The processing circuit 124 controls the receiver circuit 122 to perform data-reading again and determine whether the content of the write data content WDATA matches the content of the positive and negative edge read data content P DATA and NDATA in step 207.

When the content of the write data content WDATA matches the content of the positive and negative edge read data content PDATA and NDATA, the processing circuit 124 determines that the data-reading is normal and performs step 204 to end the flow.

When the content of the write data content WDATA does not match the content of the positive and negative edge read data content PDATA and NDATA, the processing circuit 124 determines that the configuration of the transmission circuit 120 is abnormal or the sampling unit 132 does not operate normally. As a result, the processing unit 124 inspects the configuration of the transmission circuit 120 and inspects the operation of the sampling unit 132 in step 208.

When the processing circuit 124 determines that the quantity of the positive and negative edge read data content PDATA and NDATA does not correspond to the burst mode in step 205, the processing circuit 124 controls the data-strobe enable unit 130 to perform timing calibration on the data-strobe enable signal DQS_EN in step 209.

The processing unit 124 controls the receiver circuit 122 to perform the data-reading again and determines whether the read data includes one or less than one piece of negative edge read data content NDATA in step 210. When the data includes one or less than one piece of negative edge read data content NDATA, the processing circuit 124 triggers the sampling unit 132 to sample the data signal DQ in step 211.

In an embodiment, the receiver circuit 122 further includes the terminal resistance calibration circuit 137 electrically coupled to the data-strobe port 135 to control the data-strobe port 135 to be either at the low level or the high level.

When the data includes one piece of negative edge read data content NDATA, the processing circuit 124 controls the terminal resistance calibration circuit 137 to further control the data-strobe port 135 to be at the low level to trigger the sampling unit 132. When the data includes less than one, i.e. no negative edge read data content N DATA, the processing circuit 124 controls the terminal resistance calibration circuit 137 to further control the data-strobe port 135 to be at the high level to trigger the sampling unit 132.

The processing circuit 124 further determines whether the quantity of the read data content increases in step 212.

When the quantity of the read data content increases, the processing circuit 124 determines that the sampling unit 132 does not receive the data-strobe signal DQS in step 213. The cause of the abnormal data-reading is that the memory module 10 does not successfully transmit the data-strobe signal DQS to the data-strobe port 135.

When the quantity of the read data content does not increase, the processing circuit 124 determines that a configuration of the memory controller 12 is abnormal such that the sampling unit 132 can not perform sampling. As a result, the processing circuit 124 inspects the configuration of the memory controller 12 in step 214.

When the processing circuit 124 determines that the data read includes more than one piece of negative edge read data content NDATA in step 210, the processing circuit 124 further determines whether the quantity of the positive and negative edge read data content PDATA and NDATA correspond to the burst mode in step 215.

When the quantity does not correspond to the burst mode, the processing circuit 124 inspects the configuration of the burst mode of the memory module 10 in step 216.

When the quantity corresponds to the burst mode, the processing circuit 124 controls the receiver circuit 122 to perform data-reading again. The processing circuit 124 further determines whether the content of the write data content WDATA matches the content of the positive and negative edge read data content PDATA and NDATA in step 217.

When the content of the write data content WDATA matches the content of the positive and negative edge read data content PDATA and NDATA, the processing circuit 124 determines that the data-reading is normal and terminates the flow in step 204.

When the content of the write data content WDATA does not match the content of the positive and negative edge read data content PDATA and NDATA, the processing circuit 124 determines that the configuration of the transmission circuit 120 is abnormal or the sampling unit 132 does not operate normally. As a result, the processing unit 124 inspects the configuration of the transmission circuit 120 and inspects the operation of the sampling unit 132 in step 218.

It is appreciated that the flow of the test method performed on the memory device 1 may include various stages, such as but not limited to command address (CA) training and write-leveling and can be performed before the memory test method 200 is performed. After the memory test method 200, a scanning of all the parameters can further be performed.

The advantage of the memory test method 200 in the present invention is to quickly figure out the issue that causes the abnormal data-reading of the memory module 10 according to the timing calibration of the data-strobe enable signal DQS_EN and the triggering of the sampling unit 132. No additional signal transmission by using probes is needed.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory test method for a memory device that includes a memory controller and a memory module, the memory test method comprising:
   performing, by a memory controller, data-writing on the memory module according to write data content and receiving, by the memory controller, a data-strobe signal and a data signal from the memory module;
   sampling, by a sampling unit of the memory controller, the data signal according to a positive edge and a negative edge of the data-strobe signal under a burst mode to perform data-reading to generate read data content;
   comparing the write data content and the read data content and when a quantity of the read data content does not correspond to the burst mode, performing a timing calibration on a data-strobe enable signal to adjust the data-strobe enable signal to correspond to a preamble section of the data-strobe signal, wherein the data-strobe enable signal is configured to enable the input of the data-strobe signal;
   performing the data-reading and when the quantity of the read data content does not correspond to the burst mode and when the read data content comprises one or less than one piece of negative edge read data content, triggering the sampling unit by the memory controller to sample the data signal;
   when the quantity of the read data content increases, determining the condition that the memory controller does not receive the data-strobe signal;
   when the quantity of the read data content does not increase, inspecting a configuration of the memory controller;
   when the quantity of the read data content does not correspond to the burst mode and when the read data content comprises more than one piece of negative edge read data content, inspecting the configuration of the burst mode of the memory module;
   when the quantity of the read data content corresponds to the burst mode and the read data content does not match the write data content, inspecting the configuration of a transmission circuit of the memory controller and an operation of the sampling unit; and
   when the quantity of the read data content corresponds to the burst mode and the read data content matches the write data content, terminating the test flow.

2. The memory test method of claim 1, wherein after the first data-reading is performed, when the quantity of the read data content corresponds to the burst mode and the read data content does not match the write data content, the memory test method further comprises:
   performing the timing calibration on the data-strobe enable signal to adjust the data-strobe enable signal to correspond to a preamble section of the data-strobe signal; and
   performing the data-reading again, wherein when the read data content still does not match the write data content, the configuration of the transmission circuit and the operation of the sampling unit are inspected, and when the read data content matches the write data content, the test flow is terminated.

3. The memory test method of claim 1, wherein the memory controller receives the data-strobe signal and the data signal from the memory module respectively through a data-strobe port and a data port.

4. The memory test method of claim 3, wherein when the read data content comprises one piece of negative edge read data content, the memory controller controls the data-strobe port to be at a low level to trigger the sampling unit, and when the read data content comprises less than one piece of negative edge read data content, the memory controller controls the data-strobe port to be at a high level to trigger the sampling unit.

5. The memory test method of claim 4, wherein the memory controller comprises a terminal resistance calibration circuit electrically coupled to the data-strobe port to control the data-strobe port to be either at the low level or the high level.

6. The memory test method of claim 1, further comprising:
   sampling the data signal according to the positive edge of the data-strobe signal to store a piece of positive edge read data content in a positive edge read data storage unit; and
   sampling the data signal according to the negative edge of the data-strobe signal to store a piece of negative edge read data content in a negative edge read data storage unit.

7. The memory test method of claim 1, wherein the burst mode is a four-piece data burst mode (burst4) or an eight-piece data burst mode (burst8).

8. The memory test method of claim 1, wherein the memory module is a double data rate synchronous dynamic random access memory (DDR SDRAM).

9. A memory test device comprising:
a memory module; and
a memory controller comprising:
   a transmission circuit configured to perform data-writing on the memory module according to write data content;
   a receiver circuit comprising:
      a data-strobe enable unit configured to generate a data-strobe enable signal;
      a data-strobe gate control unit configured to start receiving a data-strobe signal from the memory module according to the data-strobe enable signal; and
      a sampling unit configured to receive a data signal from the memory module to sample the data signal according to a positive edge and a negative edge of the data-strobe signal under a burst mode to perform data-reading to generate read data content; and
   a processing circuit configured to compare the write data content and the read data content and when a quantity of the read data content does not correspond to the burst mode, the processing circuit controls the data-strobe enable unit to perform a timing calibration on the data-strobe enable signal to adjust the data-strobe enable signal to correspond to a preamble section of the data-strobe signal;
wherein the processing circuit controls the receiver circuit to perform the data-reading and when the quantity of the read data content does not correspond to the burst mode and when the read data content comprises one or less than one piece of negative edge read data content, the processing circuit triggers the sampling unit to sample the data signal, and wherein when the quantity of the read data content increases, the processing circuit determines that the memory controller does not receive the data-strobe signal, and when the quantity of the read data content does not increase, the processing circuit inspects a configuration of the memory controller;
wherein the processing circuit inspects the configuration of the burst mode of the memory module when the quantity of the read data content does not correspond to the burst mode and when the read data content comprises more than one piece of negative edge read data content; and
wherein the processing circuit inspects the configuration of the transmission circuit of the memory controller and an operation of the sampling unit when the quantity of the read data content corresponds to the burst mode and the read data content does not match the write data content, and the processing circuit terminates the test flow when the quantity of the read data content corresponds to the burst mode and the read data content matches the write data content.

10. The memory test device of claim 9, wherein after the first data-reading is performed, when the quantity of the read data content corresponds to the burst mode and the read data content does not match the write data content, the processing circuit controls the data-strobe enable unit to perform the timing calibration on the data-strobe enable signal to adjust the data-strobe enable signal to correspond to a preamble section of the data-strobe signal; and
   the processing circuit controls the receiver circuit to perform the data-reading again, wherein when the read data content still does not match the write data content, the processing circuit inspects the configuration of the transmission circuit and the operation of the sampling unit, and when the read data content matches the write data content, the processing circuit terminates the test flow.

11. The memory test device of claim 9, wherein the data-strobe gate control unit and the sampling unit receive the data-strobe signal and the data signal from the memory module respectively through a data-strobe port and a data port.

12. The memory test device of claim 11, wherein when the read data content comprises one piece of negative edge read data content, the processing unit controls the data-strobe port to be at a low level to trigger the sampling unit, and when the read data content comprises less than one piece of negative edge read data content, the processing unit controls the data-strobe port to be at a high level to trigger the sampling unit.

13. The memory test device of claim 12, wherein the receiver circuit comprises a terminal resistance calibration circuit electrically coupled to the data-strobe port, and the processing unit controls the data-strobe port to be either at the low level or the high level by using the terminal resistance calibration circuit.

14. The memory test device of claim 9, wherein the memory controller further comprises:
   a positive edge read data content storage unit configured to store a piece of positive edge read data content based on the data signal sampled according to the positive edge of the data-strobe signal; and
   a negative edge read data content storage unit configured to store a piece of negative edge read data content based on the data signal sampled according to the negative edge of the data-strobe signal.

15. The memory test device of claim 9, wherein the burst mode is a four-piece data burst mode or an eight-piece data burst mode.

16. The memory test device of claim 9, wherein the memory module is a double data rate synchronous dynamic random access memory.

* * * * *